US 6,553,933 B2

(12) United States Patent
Powell et al.

(10) Patent No.: US 6,553,933 B2
(45) Date of Patent: Apr. 29, 2003

(54) APPARATUS FOR INJECTING AND MODIFYING GAS CONCENTRATION OF A META-STABLE SPECIES IN A DOWNSTREAM PLASMA REACTOR

(75) Inventors: Ronald Allan Powell, San Carlos, CA (US); Gabriel I. Font-Rodriguez, Sunnyvale, CA (US); Simon Selitser, Fremont, CA (US); Emerson Derryck Settles, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/897,531

(22) Filed: Jul. 2, 2001

(65) Prior Publication Data

US 2002/0029747 A1 Mar. 14, 2002

Related U.S. Application Data

(62) Division of application No. 09/408,756, filed on Sep. 30, 1999, now Pat. No. 6,287,643.

(51) Int. Cl.$^7$ .............................................. C23C 16/00
(52) U.S. Cl. ................................................. 118/723 IR
(58) Field of Search ..................... 156/345.48, 345.33; 118/723 IR

(56) References Cited

U.S. PATENT DOCUMENTS

| | | | | |
|---|---|---|---|---|
| 4,289,797 A | | 9/1981 | Akselrad ..................... 427/39 |
| 4,718,976 A | * | 1/1988 | Fujimura ............... 156/345.33 |
| 4,853,250 A | * | 8/1989 | Boulos et al. ......... 118/723 IR |
| 4,870,030 A | | 9/1989 | Markunas et al. ............ 437/81 |
| 4,913,929 A | | 4/1990 | Moslehi et al. ............... 427/39 |
| 4,988,644 A | | 1/1991 | Jucha et al. ................ 437/255 |

(List continued on next page.)

OTHER PUBLICATIONS

D.V. Tsu, G. Lucovsky, and M.J. Mantini; *Local Atomic Structure in Thin Films of Silicon Nitride and Silicon Diimide Produced by Remote Plasma–enhanced Chemical–vapor Deposition*, Physical Review, vol. 33, No. 10, May 15, 1986, pp. 7069–7076.

(List continued on next page.)

*Primary Examiner*—Thi Dang
(74) *Attorney, Agent, or Firm*—Delio & Peterson, LLC; Robert Curcio

(57) ABSTRACT

This invention provides an apparatus for injecting gas within a plasma reactor and tailoring the distribution of an active species generated by the remote plasma source over the substrate or wafer. The distribution may be made more or less uniform, wafer-edge concentrated, or wafer-center concentrated. A contoured plate or profiler is provided for modifying the distribution. The profiler is an axially symmetric plate, having a narrow top end and a wider bottom end, shaped to redistribute the gas flow incident upon it. The profiler is situated below an input port within the plasma reactor chamber and above the wafer. The method for tailoring the distribution of the active species over the substrate includes predetermining the profiler diameter and adjusting the profiler height over the substrate.

A coaxial injector tube, for the concurrent injection of activated and non-activated gas species, allows gases (or gas mixtures) to be delivered in an axially symmetric manner whereby one gas can be excited in a high density RF plasma, while the other gas can be prevented from excitation and/or dissociation caused by exposure to the plasma or heated surfaces in the source apparatus. The gas admixture that is not to be excited or dissociated prior to contact with the wafer surface is shielded from direct exposure to the RF field surrounding the plasma confinement tube. The tube walls are also shielded from the infrared energy emitted from the plasma. The profiler is used in conjunction with the coaxial injector tube for redistributing the excited gases emerging from the injector tube, while allowing the non-excited gases to pass through its center.

35 Claims, 5 Drawing Sheets

U.S. PATENT DOCUMENTS

| | | | |
|---|---|---|---|
| 4,996,077 A | 2/1991 | Moslehi et al. | 427/38 |
| 5,010,842 A | 4/1991 | Oda et al. | 118/723 |
| 5,105,761 A | 4/1992 | Charlet et al. | 118/723 |
| 5,180,435 A | 1/1993 | Markunas et al. | 118/723 |
| 5,256,205 A | 10/1993 | Schmitt, III et al. | 118/723 |
| 5,356,515 A * | 10/1994 | Tahara et al. | 438/715 |
| 5,453,305 A | 9/1995 | Lee | 427/562 |
| 5,609,921 A * | 3/1997 | Gitzhofer et al. | 264/117 |
| 5,674,321 A | 10/1997 | Pu et al. | 118/723 MR |
| 5,683,548 A * | 11/1997 | Hartig et al. | 118/723 I |
| 5,744,049 A | 4/1998 | Hills et al. | 216/67 |
| 5,777,289 A | 7/1998 | Hanawa et al. | 219/121.43 |
| 5,902,404 A | 5/1999 | Fong et al. | 118/723 ME |
| 6,095,085 A | 8/2000 | Agarwal | 118/723 MP |

OTHER PUBLICATIONS

J.A Theil, S.V. Hattangady, and G. Lucovsky; *Effects of $NH_3$ and $N_2$ Source Gases and Plasma Excitation Frequencies on the Reaction Chemistry for $Si_3N_4$ Thin–film Growth by Remote Plasma–enhanced Chemical–vapor Deposition;* J. Vac. Sci. Technol. A 10(4), Jul./Aug. 1992, PP 719–727.

Y. Ma, T. Yasuda, and G. Lucovsky; *Ultrathin Device Quality Oxide–nitride–oxide Heterostructure Formed by Remote Plasma Enhanced Chemical Vapor Deposition,* Appl. Phys. Lett. 64(17), Apr. 25, 1994, pp 2226–2228.

Charles Boitnott, *Downstream Plasma Processing: Considerations for Selective Etch and Other Processes,* Solid State Technology, Oct. 1994, pp 51–58.

D.V. Tsu and G. Lucovsky; *Silicon Nitride and Silicon Diimide Grown by Remote Plasma Enhanced Chemical Vapor Deposition,* J. Vac. Sci. Technol. A 4(3), May/Jun. 1986, pp 480–485.

* cited by examiner

APPARATUS FOR INJECTING AND MODIFYING GAS CONCENTRATION OF A META-STABLE SPECIES IN A DOWNSTREAM PLASMA REACTOR

BACKGROUND OF THE INVENTION

1. Field of the Invention

The present invention relates to a plasma reactor, specifically, to a method and apparatus used in the manufacture of integrated circuits and other electronic devices. More particularly, the invention relates to modifying and uniformly distributing the gas concentration of a meta-stable or atomic species over a wafer in a downstream plasma reactor.

2. Description of Related Art

Plasma-based reactions have become increasingly important to the semiconductor industry, providing for precisely controlled thin-film depositions, thin film etching, and surface treatment such as cleaning. In a deposition process, thin films are applied to semiconductor wafers; whereas, an etching process is generally used in semiconductor manufacture to remove exposed portions of the deposited film for the purpose of patterning the film. One possible method for depositing films, such as a nitride film, is a remote plasma technique. In this method, a plasma is generated at a location which is separate from the wafer. Unlike non-remote plasma processes, downstream plasma processing allows for non-wet chemical processing while eliminating plasma-induced device damage. The plasma products are allowed to flow over the wafer. In this manner, the wafer is not subjected to ion or electron bombardment, or the high heat loads typical of in-situ plasma systems. The plasma source is also equally appropriate for etching and cleaning as it is for depositing.

Candidates for downstream processing are those reactions initiated by atomic species or molecular fragments that can be generated within an active (glowing) plasma. Downstream processing generates a chemical reaction between reactive gas effluents flowing from the plasma source and the materials on the wafer. Downstream reactions are driven by the concentration and flow speed of the reactant flux to the wafer surface, the reaction rate constant, and the removal of reaction products from the reaction site. One difficulty arises, however, when a non-excited gas is required to be injected into the chamber concurrently with an excited gas. Typically, two independent chamber input ports are needed to supply both gases. The introduction of gases from two separate ports complicates the distribution of the gas mixture over the wafer surface leading to film non-uniformity.

The remote plasma enhanced chemical vapor deposition (PECVD) process affords greater control over the thin-film chemistry than the conventional PECVD process by restricting plasma excitation to a subset of the process gases, and thereby reducing the number of possible reaction pathways. The physical arrangement of a remote PECVD chamber is designed to make the process flow sequential or serial, rather than parallel as in a conventional or direct PECVD processes. A description of a remote PECVD process can be found in J. A. Theil, et al., "EFFECTS OF $NH_3$ AND $N_2$ SOURCE GASES AND PLASMA EXCITATION FREQUENCIES ON THE REACTION CHEMISTRY FOR $Si_3N_4$ THIN-FILM GROWTH BY REMOTE PLASMA-ENHANCED CHEMICAL-VAPOR DEPOSITION", J. Vac. Sci. Technology, A 10(4), July/August 1992, pp. 719–727.

Typically, a remote PECVD deposition process consists of the following steps: a) RF excitation of a first gas or gas mixture; b) transport of the excited species out of the plasma region into a chamber; c) introduction of a second gas over the substrate surface; and d) a CVD reaction at a substrate supported within the chamber to generate a thin dielectric film. For example, if a thin film silicon nitride were desired, the first gas would contain nitrogen, and the second gas would include a silicon containing gas such as Silane, $SiH_4$.

FIG. 1 is a schematic representation of a prior art remote PECVD chamber 10. Importantly, these remote PECVD chambers provide for RF coils 12 surrounding a tube 14, typically a PYREX® tube, to inductively excite a gas delivered at the top 16 of reactor 10. The excited gas is then transported into chamber 20 through input port 18. The gas disperses within chamber 20 and reacts with substrate 22 which is supported on pedestal 24. A similar PECVD chamber has been previously discussed by D. V. Tsu, et al., in "LOCAL ATOMIC STRUCTURE IN THIN FILMS OF SILICON NITRIDE AND SILICON DIIMIDE PRODUCED BY REMOTE PLASMA-ENHANCED CHEMICAL-VAPOR DEPOSITION," Physical Review B, Volume 33, Number 10, May 15, 1996, p. 7070. In the Tsu invention, a second gas is delivered through a feed-through tube to a gas dispersal ring that is placed over the substrate. This second gas is typically delivered through a second input port, shown in FIG. 1 as covered by plate 19. Although the second gas delivery apparatus, i.e., gas dispersal ring, is not common to all prior art remote PECVD chambers, it nevertheless further contributes to gas concentration non-uniformity at the wafer surface. It also represents a current prior art method for introducing a second, unexcited gas into the chamber.

Process uniformity has been previously attempted by establishing the flow dynamics that help control a uniform species distribution across the reacting surface. An inherent disadvantage of a remote plasma system, however, is the lack of acceptable process uniformity of the gas distribution at the wafer or substrate level. Since the active gases created by the plasma are delivered to the process chamber and not created in it, the distribution of gases inside the chamber is very difficult to control due to unwanted reactions on the chamber surfaces which consume the active gases. If the reactive gas flows in from the side of the reactor, with respect to the wafer, the concentration will be high in the center of the wafer and low at the edges.

In typical (non-remote) Chemical Vapor Deposition (CVD) or Plasma Enhanced Chemical Vapor Deposition (PECVD) reactors, a showerhead is used to make the gas distribution uniform over the wafer. This strategy is not suitable for downstream reactors because the active gasses would have to flow past the baffle and faceplate holes which make up the showerhead. The showerhead elements also have the effect of destroying the active species needed for remote processing.

In the case of an active atomic species being generated in the remote plasma, the showerhead elements promote recombination. In the case where the remote plasma generates a meta-stable species, the showerhead elements promote "quenching" or deactivation of the species.

The distribution of gas during plasma processing can also be affected by the introduction of a second gas. Concurrent injection of two gases (or gas mixtures) is typically performed by introducing the second (unexcited) gas through a separate input port into the chamber. However, this second injection will alter the uniform distribution of the excited gas, requiring that at least two separate distribution normalization systems or processes be employed. An apparatus and method capable of concurrent injection through the same input port would allow for unique advantages in the distribution normalization of the gas mixture, and eliminate the need for a second input to the chamber.

Additionally, concurrently providing two independent gases to the chamber through the same plasma confinement tube, one gas of which is excited by the plasma source while the other is isolated from the RF inductive and infrared radiated energies, facilitates the simultaneous introduction of diverse gas mixtures within the process chamber. Also, one may introduce a single gas within the chamber causing it to have an excited component and a non-excited component.

A supersonic CVD gas jet source for deposition of thin films has been developed in U.S. Pat. No. 5,256,205, issued to J. Schmitt, et al., entitled "MICROWAVE PLASMA ASSISTED SUPERSONIC GAS JET DEPOSITION OF THIN FILM MATERIALS." This source has been used to produce a high dielectric constant for thin film semiconductor applications, e.g., $Si_3N_4$. However, this source does not provide for simultaneous delivery of active and molecular (non-activated or dissociated) gas species.

Also, it is advantageous to have a source that is not dependent upon the supersonic flow of the material to be deposited on the semiconductor substrate. It is beneficial to have material transport and growth not made dependent only upon diffusion kinetics in high vacuum, e.g., 300 mTorr. Less process gas flow at lower chamber pressures will reduce chamber design and construction constraints.

Lastly, prior art sources of concurrent gas delivery systems are limited to an area at the wafer surface about 1 cm to 2 cm in diameter, restricted mainly by the Laval nozzle dimension, and require translation of the substrate in a complex motion in front of the nozzle in order to achieve deposition over an entire substrate of any dimension greater than approximately 1 cm.

Bearing in mind the problems and deficiencies of the prior art, it is therefore an object of the present invention to provide an apparatus and method for injecting gases and enhancing the uniformity of the active species in a remote downstream plasma reactor.

It is another object of the present invention to provide an apparatus and method for tailoring the gas concentration distribution of a remote PECVD process for wafer-edge or wafer-center concentrations.

A further object of the invention is to provide an apparatus and method for varying the gas concentration distribution across a wafer in a remote PECVD process.

Another object of the invention is to provide a remote PECVD source that can deposit uniform thin films across the entire field of the substrate with no movement or translation of the substrate or source.

It is yet another object of the present invention to provide a remote PECVD process that minimizes the loss of reactive species.

A further object of the present invention is to provide an apparatus and method to introduce gases into the chamber concurrently, through the plasma tube, having one gas excited by the plasma tube energies and the other remaining unexcited and shielded from the plasma tube energies.

Still other advantages of the invention will in part be obvious and will in part be apparent from the specification.

SUMMARY OF THE INVENTION

The above and other advantages, which will be apparent to one of skill in the art, are achieved in the present invention which is directed to, in a first aspect, a method for modifying gas flow distribution during chemical vapor deposition on a substrate within a remote plasma reactor chamber, comprising the steps of: a) establishing a remote plasma region by exciting a gas mixture with RF energy in a location removed from the chamber; b) injecting the gas mixture into the plasma region; c) transporting the excited gas mixture from the remote plasma region through an input port into the chamber; and, d) distributing the excited gas mixture over the substrate to a predetermined profile.

The method further includes causing the excited gas mixture to diffuse from the remote plasma region inward toward the chamber. The method also includes, in step (d), adjusting a contoured plate by changing the distance from the plate to the substrate to establish the predetermined profile. The predetermined profile comprises a wafer-edge concentrated distribution or a wafer-center concentrated distribution.

In a second aspect, the invention is directed to a method for modifying gas flow distribution during deposition on a substrate within a remote plasma reactor chamber, comprising the steps of: a) establishing a remote plasma region by exciting a gas mixture with RF energy in a location removed from the chamber; b) transporting the excited gas mixture from the remote plasma region through an input port in the chamber; c) redistributing the transported gas mixture within the chamber by providing a contoured plate of predetermined diameter between the input port and the substrate, the plate having a distance to the substrate; and, d) adjusting the distance to modify the gas flow distribution to the substrate.

In a third aspect, the invention is directed to a remote plasma reactor for processing a workpiece, comprising: a chamber enclosure having an input port; a remote plasma source connected to the input port and adapted to provide a means for gas transport from the source to the chamber through the input port; an inductive coil surrounding a portion of the remote plasma source capable of inductively coupling RF energy from an RF power supply; a pedestal within the chamber defining thereon a workstation to support the workpiece; and, a profiler plate within the chamber and mounted between the input port and the workpiece, the profiler plate being contoured and having a predetermined diameter and placed a predetermined distance from the workpiece.

The profiler plate is symmetric about a center axis, having a narrow top portion and a wide bottom portion, the narrow top portion mounted closest to the input port and the axis centered with the input port.

In a fourth aspect, the invention is directed to an apparatus for modifying the gas distribution within a remote plasma enhanced chemical vapor deposition reactor having a chamber with an input port, the apparatus comprising: an axial symmetrical plate having a narrow top end and a bottom end wider than the top end, and centered with respect to the input port; and, an adjustable height securing clamp connecting the plate to the reactor adjacent to the input port.

In a fifth aspect, the present invention is directed to an apparatus for concurrently administering at least two gases into a plasma excitation region of a remote plasma enhanced chemical vapor deposition reactor, comprising: a chamber having at least one input port for the gas delivery and a pedestal for securing a semiconductor wafer; a coaxial injector tube attached to the chamber, including: an outer tube for confining a first gas for plasma excitation and defining the plasma excitation region; and, an inner tube within the outer tube, for delivery of a second gas through the plasma excitation region such that the second gas remains unexcited after traversing through the plasma region.

The inner tube passes axially and concentrically through the length of the outer tube and the tubes are comprised of a dielectric material. The inner tube further comprises: a metal gas tube; a dielectric inner sleeve external to and axially concentric with the metal gas tube; a Faraday shield external to and axially concentric with the dielectric inner sleeve; and, a dielectric outer sleeve external to and axially concentric with the Faraday shield. The Faraday shield may also include an infrared reflective coating.

The present invention is directed to, in a sixth aspect, an apparatus for administering gas into a plasma excitation region of a remote plasma enhanced chemical vapor deposition reactor, comprising: a chamber having at least one input port for the gas delivery and a pedestal for securing a semiconductor wafer; a coaxial injector tube having a top end and a bottom end, attached to the chamber at the bottom end, including: an outer tube confining a first gas for plasma excitation and defining the plasma excitation region; and, an inner tube within the outer tube, for delivery of a second gas through the plasma excitation region such that the second gas remains unexcited after traversing through the plasma excitation region; and, a contoured plate having a center hole, slideably attached to the coaxial injector tube through the center hole.

The present invention is directed to, in a seventh aspect, a method for injecting two gas mixtures into a remote plasma enhanced chemical vapor deposition reactor such that a first gas is excited by plasma energy while a second gas remains unexcited by the plasma energy, the method comprising: a) providing the remote plasma enhanced chemical vapor deposition reactor having a remote plasma source, a chamber, and one input port for gas ingress into the chamber; b) establishing a plasma region by applying RF energy to energize plasma in the remote plasma source; c) injecting the first and second gases into the plasma region to the chamber through the input port; d) exciting the first gas with the plasma energy; and, e) shielding the second gas from the plasma energy such that the second gas remains in a non-excited state as it traverses through the energized plasma region.

In an eighth aspect, the present invention is directed to a method for injecting two gas mixtures into a remote plasma enhanced chemical vapor deposition reactor such that a first gas is excited by plasma energy while a second gas remains unexcited by the plasma energy, and normalizing the distribution of the gases on a wafer surface, the method comprising: a) providing the remote plasma enhanced chemical vapor deposition reactor having a remote plasma source, a chamber, and one input port for gas ingress into the chamber; b) adjusting and securing a contoured plate of predetermined diameter below the input port and above the wafer surface; c) establishing a plasma region by applying RF energy to energize plasma in the re mote plasma source; d) injecting the first and second gases into the plasma region to the chamber through the input port and towards the plate; e) exciting the first gas with the plasma energy; and, f) shielding the second gas from the plasma energy such that the second gas remains in a non-excited state as it traverses through the plasma region.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
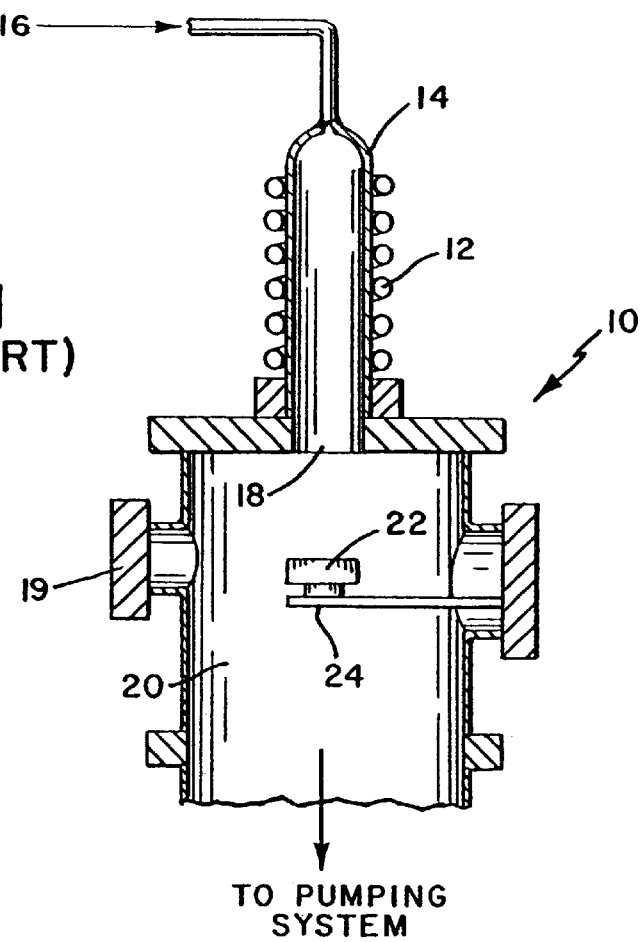
FIG. 1 is a schematic representation of a prior art remote PECVD reactor.

In describing the preferred embodiment of the present invention, reference will be made herein to FIGS. 1–6 of the drawings in which like numerals refer to like features of the invention. Features of the invention are not necessarily shown to scale in the drawings.

The Profiler

This invention provides an apparatus and method for tailoring the distribution of an active species generated by the remote plasma source over the substrate or wafer. The distribution may be made more or less uniform, wafer-edge concentrated, or wafer-center concentrated depending upon the needs of the particular process. In this manner, the present invention substantially allows for uniformity of the gas concentration of meta-stable or atomic species in a downstream (remote) plasma reactor.

For the purpose of illustration, the preferred embodiment considers the deposition of a film of Silicon Nitride, but neither the current invention nor the remote PECVD method are restricted to a given film type.

In particular, this invention relates to an axially symmetric contoured plate, hereinafter referred to as a profiler, capable of adjustment for modifying the active species concentration in a downstream reactor. By modifying this concentration, a predetermined distribution of the active gas over the wafer can be achieved in a remote PECVD process. The method using the profiler to modify the gas concentration is also delineated.

Figure 2:
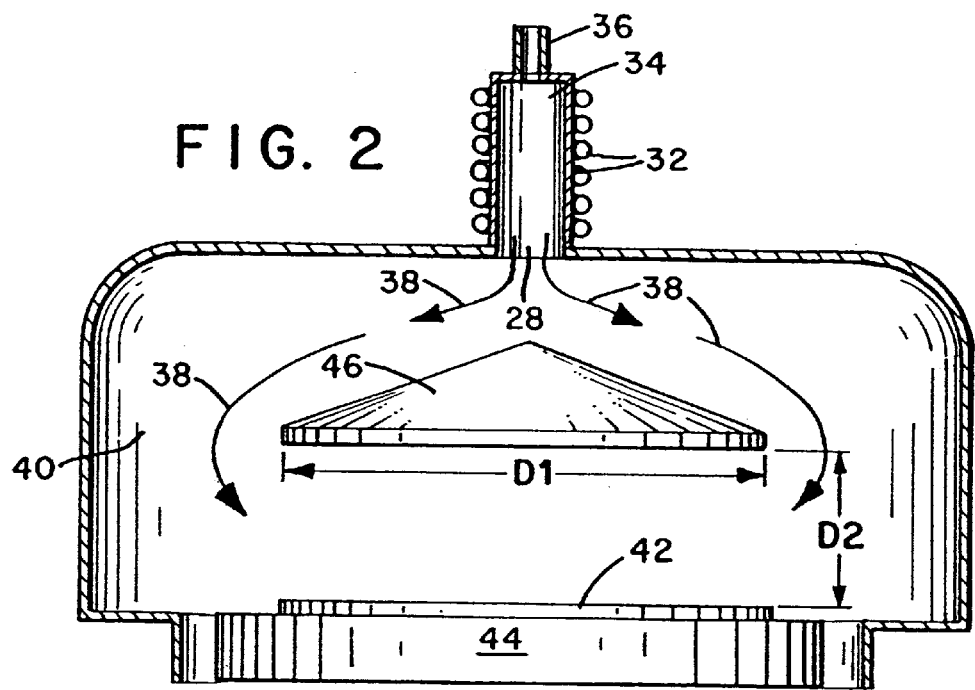
FIG. 2 is an elevated cross-sectional view of a remote PECVD reactor with a contoured plate implemented for gas distribution.

A preferred apparatus is illustrated in FIG. 2. The active gas is generated in the plasma source. Gas flows from conduit 36 to the excitation tube 34. The gas is inductively excited by RF energy as it passes through tube 34 surrounded by coils 32. The active gas enters chamber 40 through input port 28. Before flowing toward the wafer 42, however, the gas is redistributed by a profiler 46. The direction of the gas, over profiler 46, is indicated by arrows 38. The profiler is an axially symmetric contoured plate, having a narrow top end and a wider bottom end. As shown, the profiler is centered between the input port 28 and the wafer 42. The profiler is shaped to redistribute the gas flow incident upon it.

The profiler is constructed of, or coated with, a material that inhibits recombination of meta-stable species quenching, for example TEFLON™ or Tetrafluoroethylene Fluorocarbon Polymer, and the like. This minimizes the loss of reactive species. Once inside the process chamber, the reactive species diffuses from the outside of the chamber toward the inside of the chamber. The distribution of the active species over the wafer is controlled by the diameter of the profiler, D1, and the distance D2 from the wafer. The wafer 42 remains supported within the chamber by a pedestal 44.

Figure 3:
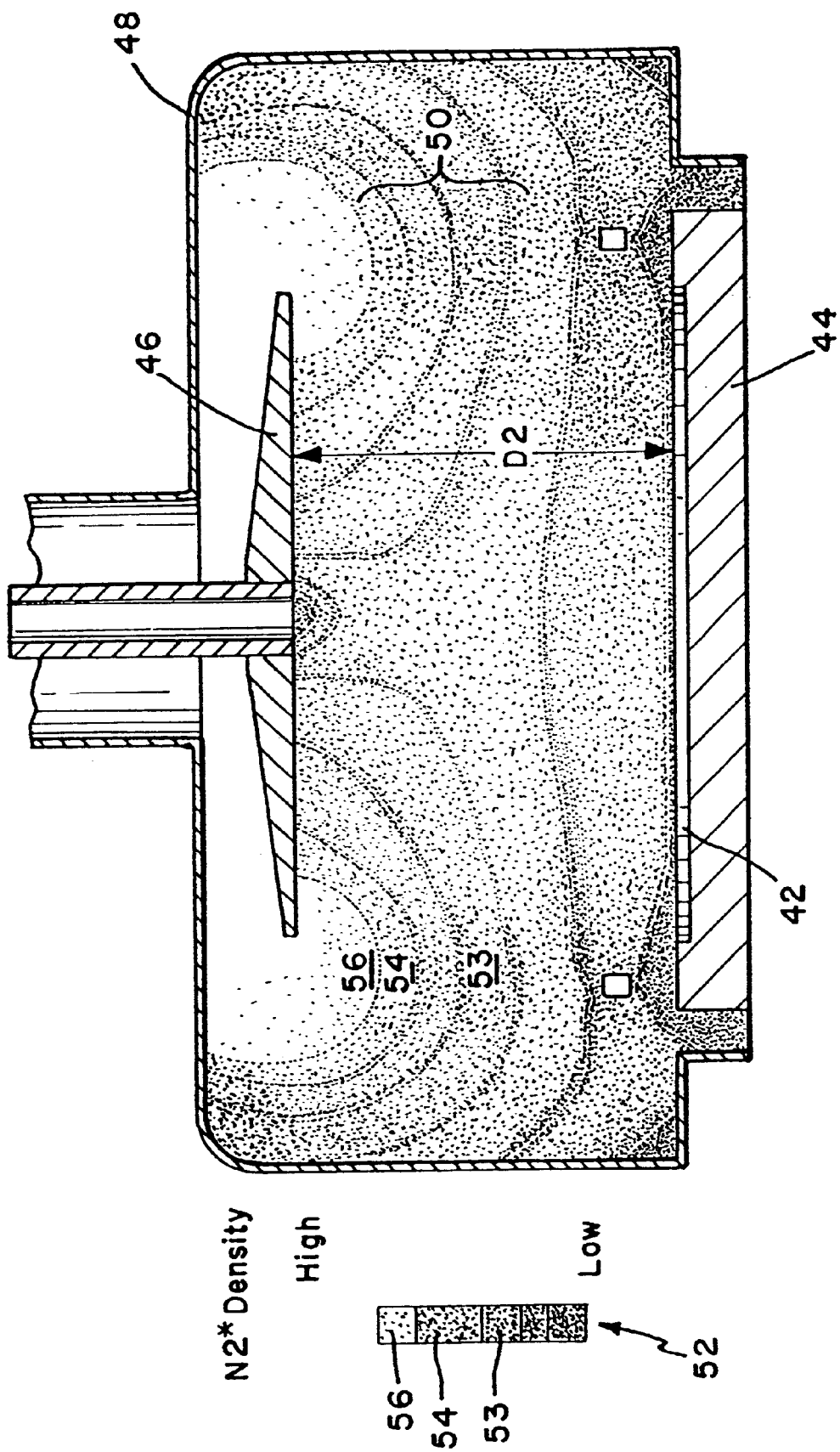
FIG. 3 is a computer generated distribution calculation using a contoured plate in a remote plasma reactor chamber.

Various gas concentration distribution scenarios have been verified by use of a computational fluid dynamics model of the downstream deposition system. FIG. 3 depicts the distribution of the active species (active gas) as calculated by this model. The profiler causes the active species to diffuse from the outside of the reactor inward. This allows the distribution of the active species over the wafer to be tailored to a desired profile. In this case, the gas is an excited molecular nitrogen, $N_2^*$, but the distribution has been shown to be similar for meta-stable nitrogen atom, $N^*$ (a nitrogen atom in an excited state), primarily because both are consumed through surface reactions. A distribution spectrum 50 is shown between the chamber wall 48 and the profiler 46. Bar chart 52 delineates the various distribution of density levels calculated. As indicated, the higher densities levels 54, 56 are furthest from the wafer 42 for a given distance D2 from the profiler. At different distances below the profiler, regions may be found where the distribution is concentrated at the wafer edges, concentrated at the center of the wafer, or more uniformly distributed about the wafer. For this calculation, the profiler to wafer distance is five (5) inches.

Figure 4:
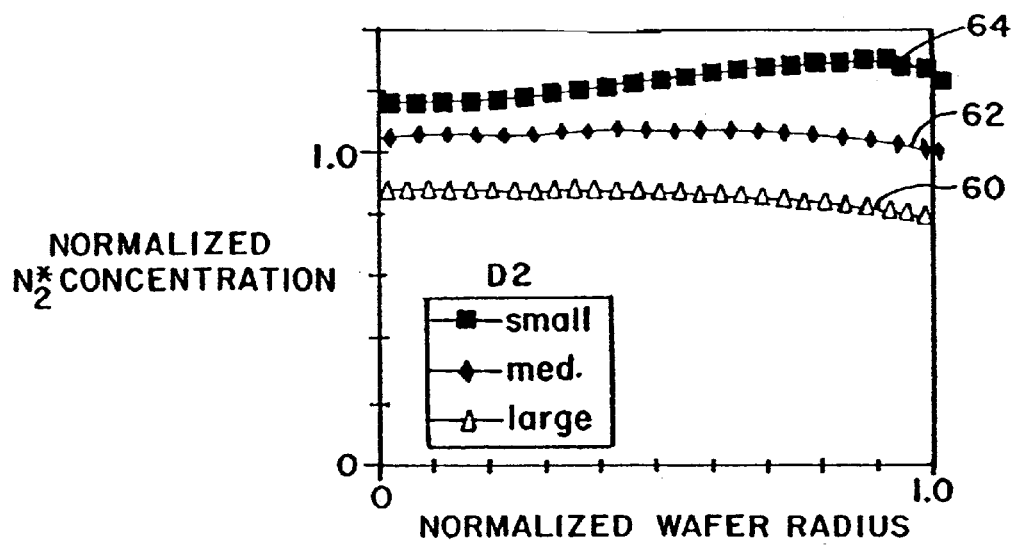
FIG. 4 depicts a normalized $N_2^*$ concentration across the wafer as a function of wafer to profiler distance.

FIG. 4 shows a normalized $N_2^*$ concentration across the wafer as a function of wafer to profiler distance D2, simulated for various distances: close to the wafer (small distance); further from the wafer (intermediate distance); and farthest from the wafer (large distance). Curves 60, 62, and 64 depict the normalized concentration levels as a function of distance D2 from the profiler to the wafer. The abscissa represents the normalized wafer radius, with "0" indicating the wafer center and "1.0" indicating the edge of the wafer. For this calculation, 1.0 represented a 100 mm wafer radius, for a 200 mm diameter wafer. The results confirm that the distribution of active species over the wafer can be tailored to any desired shape or made uniform with the use of the profiler. As indicated by curve 30 64, the $N_2^*$ concentration may be regulated to have a greater concentration or density at the edge of the wafer than at the center. In contrast, curve 60 depicts the reverse concentration condition; having a greater density at the wafer center rather than at the wafer edge. As shown, these different concentration distributions are regulated by the profiler distance to the wafer.

The profiler solves a long standing uniformity problem inherent to remote plasma deposition systems in a simple and inexpensive manner. It allows the distribution of the active species not only to be made more uniform, but also to be tailored to the needs of the process.

The Coaxial Injector Tube

In situations where a second gas is injected within the chamber, it is beneficial to take advantage of the profiler's distribution normalization. However, this requires the second gas to be injected concurrently with the first (excited) gas. A coaxial remote PECVD source for the concurrent injection of activated and non-activated gas species has been developed to allow two gases (or gas mixtures) to be delivered in an axially symmetric manner whereby one gas can be excited in a high density RF plasma, while the other gas can be prevented from excitation and/or dissociation caused by exposure to the plasma or heated surfaces in the source apparatus.

As a specific illustration, remote PECVD of silicon nitride could be accomplished using concurrent injection of a nitrogen containing gas, e.g., $He/N_2$, $He/NH_3$, and a silicon containing gas, e.g., $He/SiH_4$, such that the former gas is activated in the source and the latter is not. This capability provides a method to increase the uniformity of distribution of the reactant gas species at the wafer surface, particularly when used in conjunction with an annular gas injection ring near the substrate surface while maintaining separation of the desired species/admixtures from the plasma region.

Figure 5:
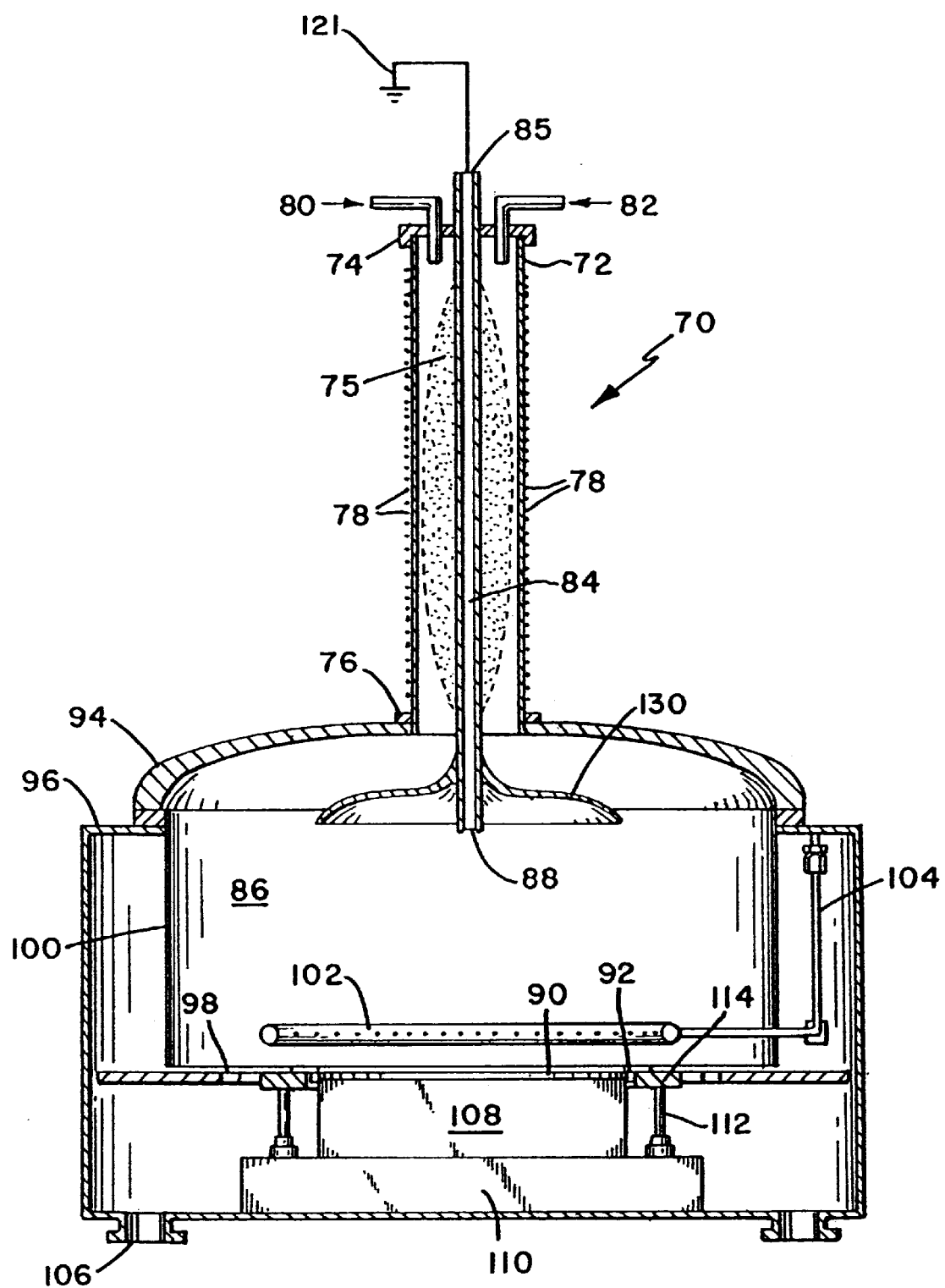
FIG. 5 depicts an elevated cross-sectional view of a coaxial remote plasma source and chamber.

Referring to FIG. 5, a coaxial remote plasma source 70 and chamber 86 are depicted. The remote plasma source includes two concentric tubes, an outer tube 72 used for plasma confinement and excitation, and an inner coaxial tube 84 used for importing gas to the chamber while shielding the gas from excitation. The chamber consists of a chamber dome 94 and an M2i chamber 96. A process confinement shield 100 encloses the process reactions. Substrate 90 is held in place on a pedestal using clamp ring 92. The substrate is heated through heater 108, mounted on heater flange 110. A clamp lift pin 112 provides support from heater flange 110 to a lift ring shield 114. An annular gas ring 102 is mounted over substrate 90 to provide another input for gas into the chamber. A gas ring supply line 104 connects to annular gas ring 102 and provides an input port to the chamber. The chamber also includes a port 106 for a process pump.

The compact coaxial remote plasma source 70, well suited for remote PECVD, consists of the outer plasma confinement tube or sleeve 72 which can be made of a suitable dielectric material, e.g., quartz, alumina, and the like. The tube is closed at the top end to atmosphere by an upper vacuum flange 74. At the lower end, it is open to the process chamber, but closed to atmosphere by a lower vacuum flange 76. An external RF coil 78 is wound about the plasma confinement tube 72. Preferably, the coil is wound in two to twelve turns. Gas inlet lines 80, 82, entering at the top of the plasma confinement tube through the upper vacuum flange 74, provide injection ports for introduction of the desired gases or gas admixtures, e.g., He, Ar, $He/N_2$, $He/O_2$, and the like, to the plasma region 75.

The RF coils 78 are connected to a suitable RF generator or power supply (not shown). The power supply frequency may vary, typically ranging from 400 KHz to the preferred value of 13.56 MHz at less than 1 kilowatt, but may also be at higher frequencies and higher power. The RF connections are typically made through an RF matchbox, and the coils are energized at the beginning of the deposition process. The gas admixture, e.g., $He/N_2$, $He/O_2$, $O_2$, $N_2$, $Ar/N_2$, $He/N_2$, $Ar/O_2$, He, Ar, $He/H_2$, or $H_2$, passing through the coupled RF field produces a high-density plasma and the desired activated gas species, e.g., meta-stable helium, $He^*$, atomic nitrogen, $N^*$, excited molecular nitrogen, $N_2^*$, ionized molecular nitrogen, $N_2^+$, atomic oxygen, $O^*$, and the like. The activated gas species exit the lower end of the tube into the process chamber 86, where they diffuse to the surface of the wafer. Importantly, the excited gases may be distributed by a modified profiler 130, diffusing the gasses in the manner previously described.

The coaxial injector tube assembly 84 passes concentrically through the length of the plasma confinement tube 72. As with the plasma confinement tube, the lower end of the injector tube, the coaxial injector exit 88, is also open to the process chamber 86. A gas or gas admixture, e.g., $He/SiH_4$, which is not to be excited or dissociated prior to contact with the surface of wafer 90, is transported via the coaxial gas inlet 85 at the upper vacuum flange 74 through the high density plasma region 75 to process chamber 86. The non-excited gases do not traverse around profiler 130, rather, the coaxial injector tube exit 88 opens below the profiler plate. This allows the non-excited gases to mix with a more uniformly distributed excited gas from the plasma source region.

Importantly, the non-excited gas and the excited gas may be the same type of gas. This allows for the simultaneous introduction of a gas within the reactor from a single source that will ultimately have an excited component and a non-excited component. The independent excited portion of the gas would then flow incident on profiler 130 and combine with its non-excited counterpart delivered through the coaxial injector tube exit port 88.

Gas exiting the coaxial injector tube diffuses to the surface of the heated substrate where it is free to react with the activated gas species produced in the plasma region 75 of the plasma confinement tube 72, thereby resulting in the formation of the desired thin film on the substrate.

Importantly, the gas admixture, e.g., $SiH_4$, that is not to be excited or dissociated prior to contact with the wafer surface must not be directly exposed to the RF field surrounding the plasma confinement tube. Nor must the tube walls be heated appreciably by radiation emitted from the plasma. This may be accomplished in one of two ways. Referring to FIG. 6, the innermost gas tube 120 of the coaxial injector tube 84, preferably made of stainless steel, Al, Al alloys, Ti, or Mo, and the like, is both a conduit for the gas admixture and a grounded RF shield 121. RF energy radiating from the RF coils 78 into the plasma confinement tube 72 will be absorbed in the metal tube 120 and shunted to ground.

The remote source apparatus utilizes the walls of this central metal coaxial injector tube 84 as an RF shield to prevent the gas admixture in the central tube from igniting a plasma or becoming excited (ionized) during transit through the high density RF plasma region of the outer tube. The RF shield may also incorporate an infrared reflective metal Faraday shield 122, external to the central injector tube 120, to prevent thermal decomposition or cracking of species in the gas admixture caused by plasma-radiation heating or induction heating of the inner wall surface. The metallic Faraday shield, over coated with a highly IR-reflective material, e.g., rhodium and the like, serves to reflect IR radiation from the plasma region that would otherwise heat the inner tube walls. Other embodiments of the basic idea include simplifying the design by replacing the metal inner tube with a quartz tube, and to depend upon the Faraday shield alone to reduce the RF fields in the tube to levels below that required for plasma excitation.

The RF field may also induce eddy currents in a directly exposed metallic tube. This could result in induction heating of the tube walls, which could result in gas dissociation if sufficiently high temperatures were reached. To minimize or eliminate induction heating, the copper Faraday shield 122 is wrapped about the metal innermost gas tube 120. By design, the Faraday shield inhibits the circulation of eddy currents thereby substantially eliminating induction heating. An inner quartz dielectric sleeve 124 may be inserted between the metal gas tube 120 and the copper Faraday shield 122 to minimize direct thermal contact (coupling) between the metallic parts and to discourage the formation of unwanted plasma discharges in this region. A Faraday slit 123 may also be designed into the shield structure to facilitate the elimination of eddy currents.

The metal gas tube 120, inner quartz dielectric sleeve 124, and Faraday shield 122 are enclosed within an outer quartz dielectric tube 126. This outer quartz tube serves to sleeve and isolate the inner components from the plasma discharge in the plasma confinement tube 72, and also represents a vacuum barrier between the source interior and the atmosphere. This vacuum barrier or seal 128 is closed at the lower end of the outer quartz dielectric sleeve 126 and metal gas tube 120 by fusing the outer quartz sleeve to the metal tube 120. Preferably, this seal is accomplished through an SST-Kovar-glass intermediary.

As shown, a modified profiler 130 may be used with the coaxial injector tube to regulate the distribution uniformity of the gases in the same manner as previously discussed. As depicted in FIG. 6A, the profiler is modified to accept the coaxial injector tube through a hole at its center. Height adjustment clamps 132 are located on the profiler to secure the profiler to the coaxial injector tube and regulate the distance from the profiler to the substrate. The profiler distributes the excited gas while allowing the non-excited gas to traverse through its center toward the substrate.

Figure 6B:
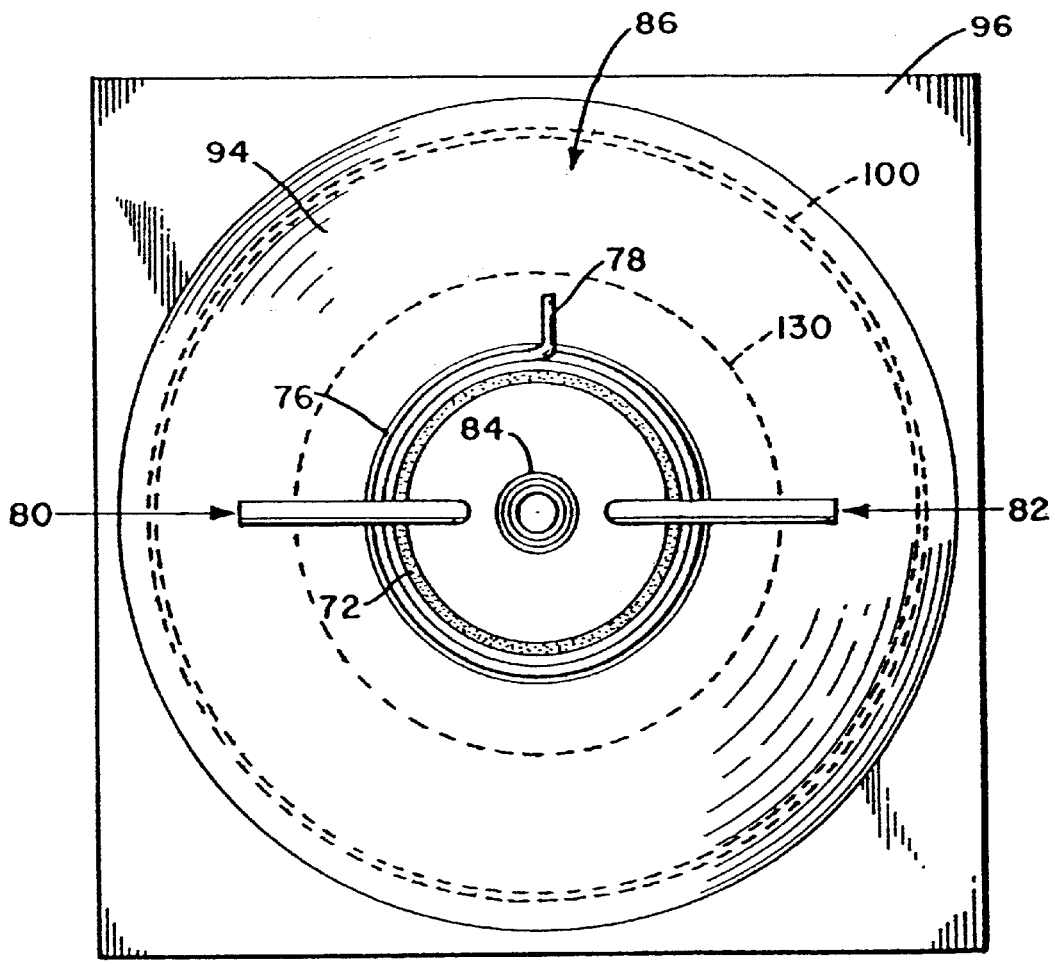
FIG. 6B is a top view of a remote PECVD reactor having a profiler and coaxial injector tube.
Figure 6A:
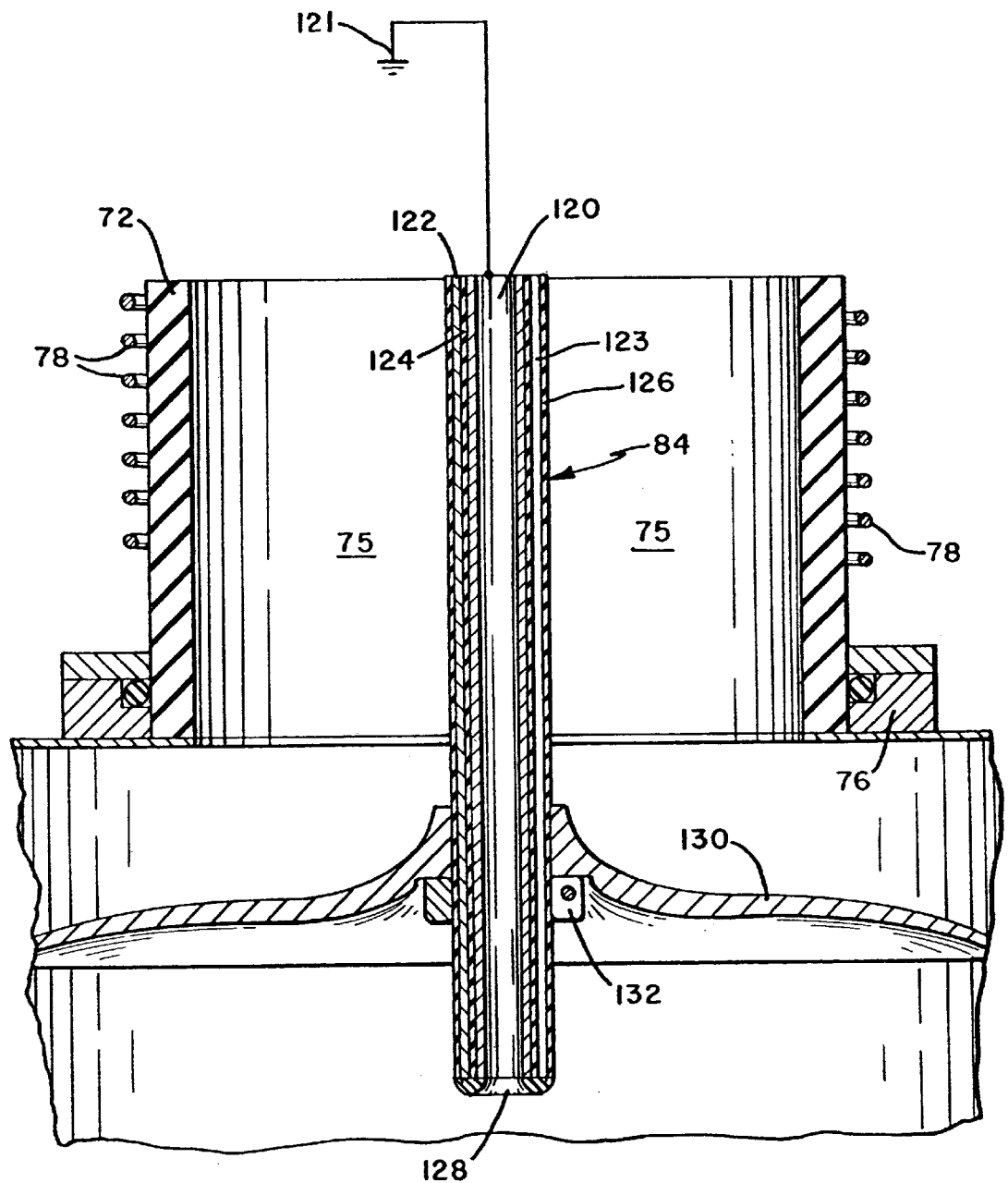
FIG. 6A is an elevated cross-sectional view of the multiple layers of the coaxial injector tube.

FIG. 6B depicts a top view of profiler 130 in a remote PECVD reactor. The axial symmetry is shown along with the coaxial injector tube 84 wound with RF coils 78 and traversing through the center aperture of the profiler.

The method for simultaneously injecting two gas mixtures into a chamber of a remote plasma enhanced chemical vapor deposition reactor includes ensuring that the first gas is excited by plasma energy while the second gas remains unexcited by the plasma energy. This method includes the steps of: a) providing a remote plasma enhanced chemical vapor deposition reactor that has a coaxial injector tube connecting to one main input port for gas ingress into the chamber; b) establishing the plasma region by applying RF energy to energize plasma in the plasma confined region; c) injecting two gas mixtures into the plasma region to the chamber through the input port; d) exciting one of the gas mixtures with the plasma energy; and, e) shielding the second gas from the plasma energy such that the second gas remains in a non-excited state as it traverses through the energized plasma region.

Importantly, both gases or gas mixtures traverse through the same plasma tube while the plasma tube is excited by RF coils surrounding the plasma tube's outer surface. The coaxial injector tube shields one of the injected gases from the plasma energy. As previously discussed, this shield can be either an electrical shield (Faraday shield), an IR shield, or both.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A remote plasma reactor for processing a workpiece, comprising:
   a chamber enclosure having an input port;
   a remote plasma source connected to said input port and adapted to provide a means for gas transport from said remote plasma source to said chamber through said input port;
   an inductive coil surrounding a portion of said remote plasma source capable of inductively coupling RF energy from an RF power supply;
   a pedestal within said chamber defining thereon a workstation to support said workpiece; and, a profiler plate within said chamber and mounted between said input port and said workpiece, said profiler plate being contoured and having a predetermined diameter and placed a distance from said workpiece.

2. The apparatus of claim 1 wherein said profiler plate is symmetric about a center axis, having a narrow top portion and a wide bottom portion, said narrow top portion mounted closest to said input port, and said axis centered with said input port.

3. The apparatus of claim 2 wherein said profiler plate is constructed of a material that inhibits recombination.

4. The apparatus of claim 2 wherein profiler plate is constructed of a material that inhibits meta-stable species quenching.

5. The apparatus of claim 2 wherein said profiler plate has a TEFLON™ or Tetrafluoroethylene Fluorocarbon Polymer outer coating.

6. The apparatus of claim 1 wherein said remote plasma source is adapted to provide excited gas to said chamber.

7. The apparatus of claim 6 wherein said excited gas comprises meta-stable atomic nitrogen.

8. The apparatus of claim 6 wherein said excited gas comprises one of the following gases: molecular nitrogen, $He/N_2$, $He/O_2$, $O_2$, $N_2$, $Ar/N_2$, $He/N_2$, $Ar/O_2$, He, Ar, $He/H_2$, or $H_2$.

9. The apparatus of claim 1 further comprising the means for adjusting the profiler plate distance towards and away said workpiece.

10. An apparatus for modifying the gas distribution within a remote plasma enhanced chemical vapor deposition reactor having a chamber with an input port, said apparatus comprising:
   an axial symmetrical plate having a narrow top end and a bottom end wider than said top end, and centered with respect to said input port; and,
   an adjustable height securing clamp securing said plate adjacent to said input port.

11. An apparatus for concurrently administering at least two gases into a plasma excitation region of a remote plasma enhanced chemical vapor deposition reactor, comprising:
   a chamber having at least one input port for gas delivery and a pedestal for securing a semiconductor wafer;
   a coaxial injector tube attached to said chamber, including:
      an outer tube for confining a first gas for plasma excitation and defining said plasma excitation region;
      RF coils wound around said outer tube and connected to an RF generator for exciting said plasma excitation region and generating plasma of said first gas; and,
      an inner tube within said outer tube, for delivery of a second gas through said plasma excitation region such that said second gas remains unexcited after traversing through said plasma region.

12. The apparatus of claim 11 wherein said inner tube passes axially and concentrically through the length of said outer tube.

13. The apparatus of claim 11 wherein said outer tube comprise a dielectric material.

14. The apparatus of claim 13 wherein said dielectric material is a quartz material.

15. The apparatus of claim 13 wherein said dielectric material is alumina.

16. An apparatus for concurrently administering at least two gases into a plasma excitation region of a remote plasma enhanced chemical vapor deposition reactor, comprising:
   a chamber having at least one input port for gas delivery and a pedestal for securing a semiconductor wafer;
   a coaxial injector tube attached to said chamber, including:
      an outer tube for confining a first gas for plasma excitation and defining said plasma excitation region; and,
      an inner tube within said outer tube, for delivery of a second gas through said plasma excitation region such that said second gas remains unexcited after traversing through said plasma region, said inner tube comprising:
         a metal gas tube;
         a dielectric inner sleeve external to and axially concentric with said metal gas tube;
         a Faraday shield external to and axially concentric with said dielectric inner sleeve; and,
         a dielectric outer sleeve external to and axially concentric with said Faraday shield.

17. The apparatus of claim 16 wherein said inner and outer sleeves comprise a quartz material.

18. The apparatus of claim 16 having said Faraday shield further comprise an infrared reflective coating.

19. The apparatus of claim 18 wherein said infrared reflective coating comprises a rhodium composite material.

20. The apparatus of claim 16 wherein said metal gas tube comprises any one of the following materials: Al, Al alloy, Ti, Mo, or stainless steel.

21. The apparatus of claim 16 wherein said outer tube is wound by RF coils.

22. The apparatus of claim 21 wherein said RF coils are wound in two to twelve turns around said outer tube.

23. The apparatus of claim 21 wherein said RF coils are electrically connected to an RF generator.

24. The apparatus of claim 23 wherein said RF generator is adapted to be operational at 13.56 MHz for power levels at less than one kilowatt.

25. An apparatus for administering gas into a plasma excitation region of a remote plasma enhanced chemical vapor deposition reactor, comprising:
   a chamber having at least one input port for gas delivery and a pedestal for securing a semiconductor wafer;
   a coaxial injector tube having a top end and a bottom end, attached to said chamber at said bottom end, including:
      an outer tube confining a first gas for plasma excitation and defining said plasma excitation region; and,
      an inner tube within said outer tube, for delivery of a second gas through said plasma excitation region such that said second gas remains unexcited after traversing through said plasma excitation region; and,
   a contoured plate having a center hole, slideably attached to said coaxial injector tube through said center hole.

26. The apparatus of claim 25 wherein said coaxial injector tube further includes a lower flange at said bottom end and an upper flange at said top end to secure a vacuum within said injector tube.

27. The apparatus of claim 26 wherein said upper flange further includes ports for gas ingress.

28. The apparatus of claim 25 wherein said inner tube further comprises:
   a metal gas tube;
   a dielectric inner sleeve external to and axially concentric with said metal gas tube;
   a Faraday shield external to and axially concentric with said dielectric inner sleeve; and, a dielectric outer sleeve-external to and axially concentric with said Faraday shield.

29. The apparatus of claim 28 wherein said metal gas tube is connected to ground potential.

30. The apparatus of claim 28 wherein said inner and outer sleeves are comprised of a quartz material.

31. The apparatus of claim 28 wherein said Faraday shield further comprises an infrared reflective coating.

32. The apparatus of claim 28 wherein said Faraday shield includes a slit to reduce eddy currents.

33. The apparatus of claim 31 wherein said infrared reflective coating comprises a rhodium composition.

34. The apparatus of claim 28 wherein said metal gas tube comprises any one of the following materials: Al, Al alloy, Ti, Mo, or stainless steel.

35. The apparatus of claim 25 wherein said outer tube is wound by RF coils.

* * * * *

UNITED STATES PATENT AND TRADEMARK OFFICE
CERTIFICATE OF CORRECTION

PATENT NO. : 6,553,933 B2
DATED : April 29, 2003
INVENTOR(S) : Powell et al.

It is certified that error appears in the above-identified patent and that said Letters Patent is hereby corrected as shown below:

Column 5,
Line 57, delete "re mote" and substitute therefor -- remote --.

Column 7,
Line 44, delete "30".

Column 11,
Line 12, after "wherein" insert -- said --.

Signed and Sealed this

Seventh Day of October, 2003

JAMES E. ROGAN
*Director of the United States Patent and Trademark Office*